(12) United States Patent
Nakahara

(10) Patent No.: US 6,216,341 B1
(45) Date of Patent: Apr. 17, 2001

(54) SURFACE MOUNTING METHOD OF ELECTRONIC COMPONENTS

(75) Inventor: Kazuhiko Nakahara, Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/354,569

(22) Filed: Jul. 16, 1999

(30) Foreign Application Priority Data

Jul. 16, 1998 (JP) .................................................. 10-201564

(51) Int. Cl.[7] ...................................................... H05K 3/30
(52) U.S. Cl. ................................ 29/833; 29/825; 29/830; 29/832
(58) Field of Search ............................... 29/830, 832, 833, 29/834, 825

(56) References Cited

U.S. PATENT DOCUMENTS

| | | | |
|---|---|---|---|
| 4,979,290 | * 12/1990 | Chiba ........................................ | 29/833 |
| 4,980,971 | * 1/1991 | Bartscht et al. ........................... | 29/833 |
| 5,084,959 | * 2/1992 | Ando et al. ............................... | 29/833 |
| 5,172,468 | * 12/1992 | Tanaka et al. ............................. | 29/833 |
| 5,249,356 | * 10/1993 | Okuda et al. .............................. | 29/833 |
| 5,379,514 | * 1/1995 | Okuda et al. .............................. | 29/833 |
| 5,911,456 | * 6/1999 | Tsubouchi et al. ........................ | 29/833 |
| 5,992,013 | * 11/1999 | Morita ....................................... | 29/833 |
| 6,016,599 | * 1/2000 | Morita et al. .............................. | 29/833 |

* cited by examiner

*Primary Examiner*—Carl J. Arbes
(74) *Attorney, Agent, or Firm*—Wenderoth, Lind & Ponack, LLP.

(57) ABSTRACT

In a method of mounting electronic components on a surface, where an electronic component is picked up by a moving head and is mounted onto a printed circuit board, a board recognition camera moves together with a mounting head and recognizes a recognition point set on a first board block of a board which is divided into a plurality of sections. After mounting an electronic component onto the first board block, a judgement is made whether or not a recognition point exists along the travelling path of the mounting head from a mounting position to the place for the next action. When it is judged that there is a recognition point, the board recognition camera is moved to the recognition point during the travelling and causes the camera to recognize the recognition point. As a result, useless travelling of the mounting head is eliminated and a tact time is shortened.

12 Claims, 5 Drawing Sheets

SURFACE MOUNTING METHOD OF ELECTRONIC COMPONENTS

FIELD OF THE INVENTION

The present invention relates to a surface mounting method for mounting electronic components onto a printed circuit board(hereinafter called board).

BACKGROUND OF THE INVENTION

During surface mounting of electronic components onto a board, in order to secure accuracy of mounting position, position correction is carried out by a method of image recognition. With the aforesaid method, the accuracy of mounting is improved by correcting an amount of travel of a mounting head carrying an electronic component based upon results of a recognition of the accurate position of the board by sensing a recognition mark set at a recognition point of the board. And it is also improved by recognition of an incorrect positioning of the electronic component which is carried on the mounting head, by picking up the image of a status (e.g. orientation) of the electronic component. Generally, in order to simplify the driving system, a method of moving a board recognition camera together with a mounting head is used in the aforesaid method.

As to the board for surface mounting of the electronic components, there are several kind of boards, such as a board on which plural board patterns are printed so that it can be divided into plural board blocks of the same kind, plural boards of the same kind, and an individual board, and these boards are placed on a board carrier of a surface mounting device. Each board block or board has individual recognition points.

With the conventional method of surface mounting of electronic components, after performing the position recognition of the board by detecting the image of the recognition mark of each board using a camera, the surface mounting operation is carried out to mount electronic components onto each board. With the conventional method, however, since the board position recognition camera and the mounting head move together along plural board blocks or a board only for the purpose of detecting images, the original function of the mounting head (i.e. picking up electronic components from a feeder and transferring these electronic components to the boards) is suspended during the image detection action.

And then, surface mounting action is carried out in which the mounting head repeats the going and returning travel along the board blocks or the board, to pick up and mount electronic components and, during this surface mounting action, the camera does not detect any images at all.

Namely, when observing a specific portion of a board, the mounting head passes that portion plurality times, including during the board recognition (image detection) and then during electronic component mounting.

As a result, the travelling path of the mounting head is extremely complicated and the total travelling distance is long. Therefore, it has been a problem that a tact time (a time period from processing of one board to processing of the next board) is prolonged due to the length of the travelling perod.

The purpose of the present invention is to provide an efficient surface mounting method of electronic components with a short tact time.

SUMMARY OF THE INVENTION

The surface mounting method, of electronic components of the present invention comprises:

providing a board recognition camera and a mounting head which move together unitarily;

recognizing a board recognition point set on a board by using the board recognition camera moving unitarily together with the mounting head;

having the mounting head undergo travel to pick up and transfer electronic components from an electronic component feeder to the board, and then mount the electronic components onto the board;

during the travel of the mounting head together with the board recognition camera, judging whether a position recognition point exists along a travelling path of the mounting head; and when it is judged during the travel that the position recognition point exists along the travelling path, recognizing the position recognition point by moving the recognition camera to the position recognition point. According to the surface mounting method of the present invention, the recognizing of the board recognition point occurs prior to surface mounting of electronic components onto the board.

According to the present invention, a controller judges whether or not a recognition point exists along the travelling path (i.e. on or nearby the travelling path so as to be viewable by the camera) of the mounting head during the travelling period for the next action. The cameras can be chosen so as to have certain specifications, including field of view, suitable to the particular application. Thus, a useless travelling period of the mounting head is eliminated by moving the board recognition camera to the recognition point and having it recognize the position.

DESCRIPTION OF THE PREFERRED EMBODIMENTS

Figure 1:
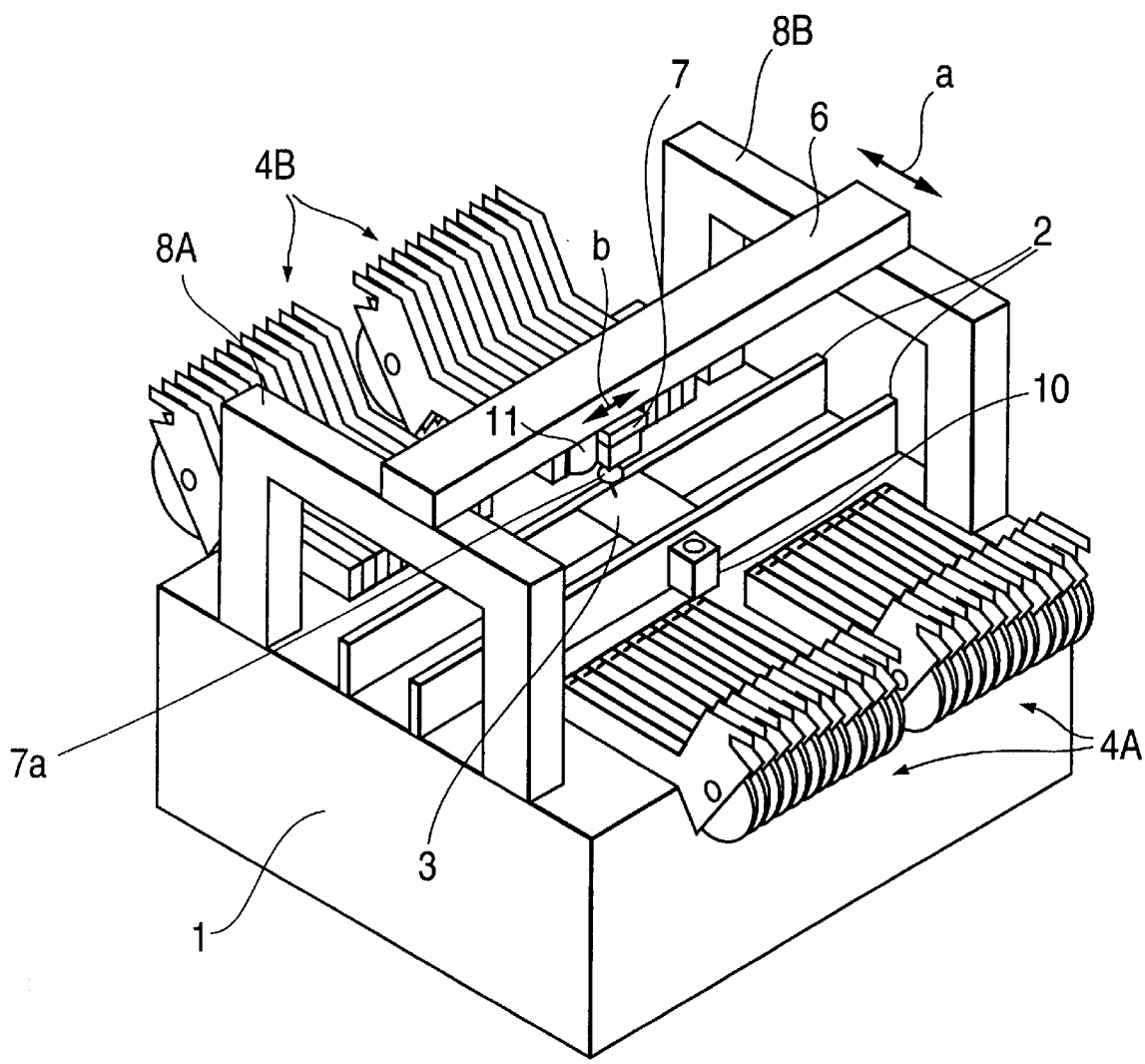
FIG. 1 is a perspective view of a surface mounting apparatus for explaining an embodiment of a surface mounting method of electronic components according to the present invention.
Figure 2:
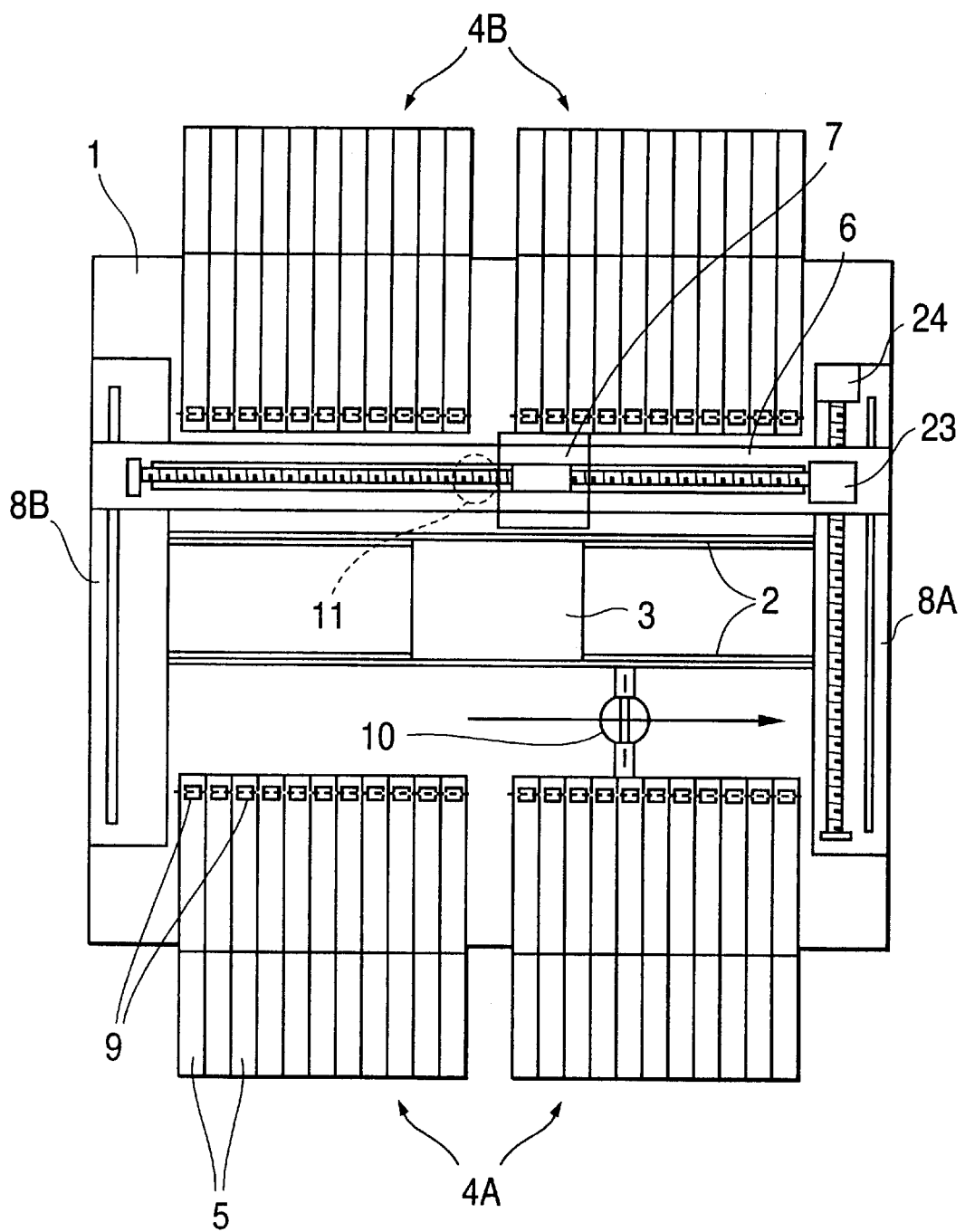
FIG. 2 is a plan view of the surface mounting apparatus.

With reference to FIG. 1 and FIG. 2, an exemplary embodiment of the surface mounting method of electronic components of the present invention will now be described.

In FIG. 1, a carrier path 2 is set at the center of a base table 1 along the X direction. The carrier path 2 is for transferring a board 3 and for determining the position thereof. Therefore, the carrier path 2 constitutes a board setting stand. First and second electronic component feeders 4A and 4B are placed on opposite sides of the carrier path 2, and a number of tape feeders 5 are provided for each feeder 4A and 4B. Each tape feeder 5 contains electronic components held on a tape and feeds the electronic components by advancing the tape pitch by pitch.

An X axis table 6 is equipped with a mounting head 7 for electronic components and is supported at opposite ends with a Y axis table 8A and a guide 8B, respectively. Therefore, the mounting head 7 moves horizontally due to driving of the X axis table 6 and the Y axis table 8A, and picks up electronic components from a pick-up position 9 of one of the tape feeders 5 with a nozzle 7a mounted on the bottom portion of the mounting head and mounts the electronic components onto the board 3. A first camera 10 for electronic component recognition is placed between the carrier path 2 and the feeder 4A. A second camera 11 for board recognition is mounted along with the mounting head 7, and travels unitarily together with the mounting head 7. The second camera 11 is provided to detect the image of the board 3 from above and recognizes the recognition mark provided on the board 3. The first and second cameras 10, 11 can be of a type known in the art for use in surface mounting of electronic components, and whose specifications, including field of view, are known.

Next, with reference to FIG. 3, the control system of the surface mounting apparatus will be described.

Figure 3:
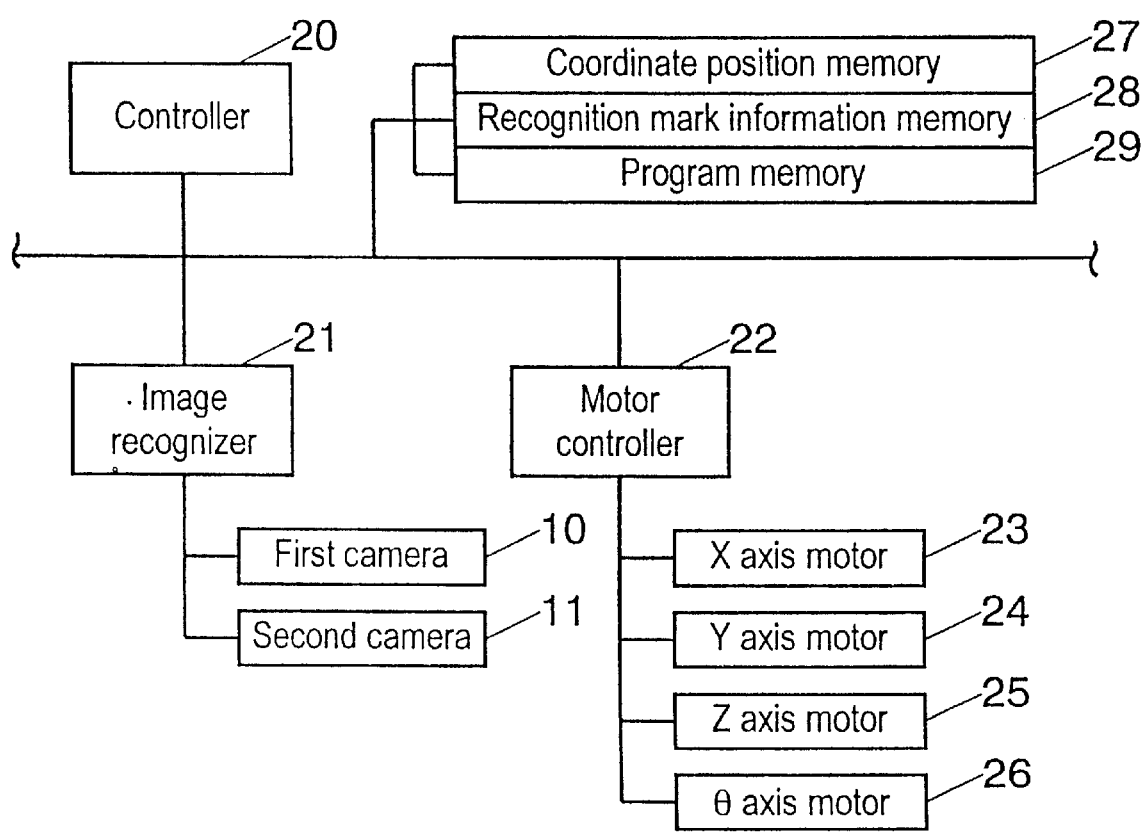
FIG. 3 is a block diagram of a control system of the surface mounting apparatus.

In FIG. 3, a controller 20 is a CPU and controls the entire apparatus, including every section explained hereinafter. An image recognizer 21 performs recognition of incorrect positioning of electronic components via the first camera 10 and performs position recognition of a recognition mark set at a recognition point on a board via the second camera 11. A motor controller 22 controls the actions of an X axis motor 23, a Y axis motor 24, a Z axis motor 25, and a θ axis motor 26 to thereby control horizontal travel, vertical travel and rotation of the mounting head 7. The Z axis motor 25 and the θ axis motor 26 are shown in FIG. 3 but not in FIG. 2.

A coordinate position memory 27 memorizes the data of coordinates of mounting positions of electronic components which are to be mounted onto the board 3. A recognition mark information memory 28 memorizes information (data of recognition marks) for board position detection that are formed at recognition points on the boards 3, and information for the recognition marks for position correction, during electronic component mounting. A program memory 29 memorizes the mounting action programs for different kinds of boards, respectively, namely the combined action program of mounting action by the mounting head 7 and of image detection action by the second camera 11 which travels unitarily together with the mounting head 7. For this action program, program data drawn up off-line can be input or, by having a program generating function in the controller 20, the action program can be generated automatically based upon the data from the coordinate position memory 27 and the recognition mark information memory 28.

Figure 4:
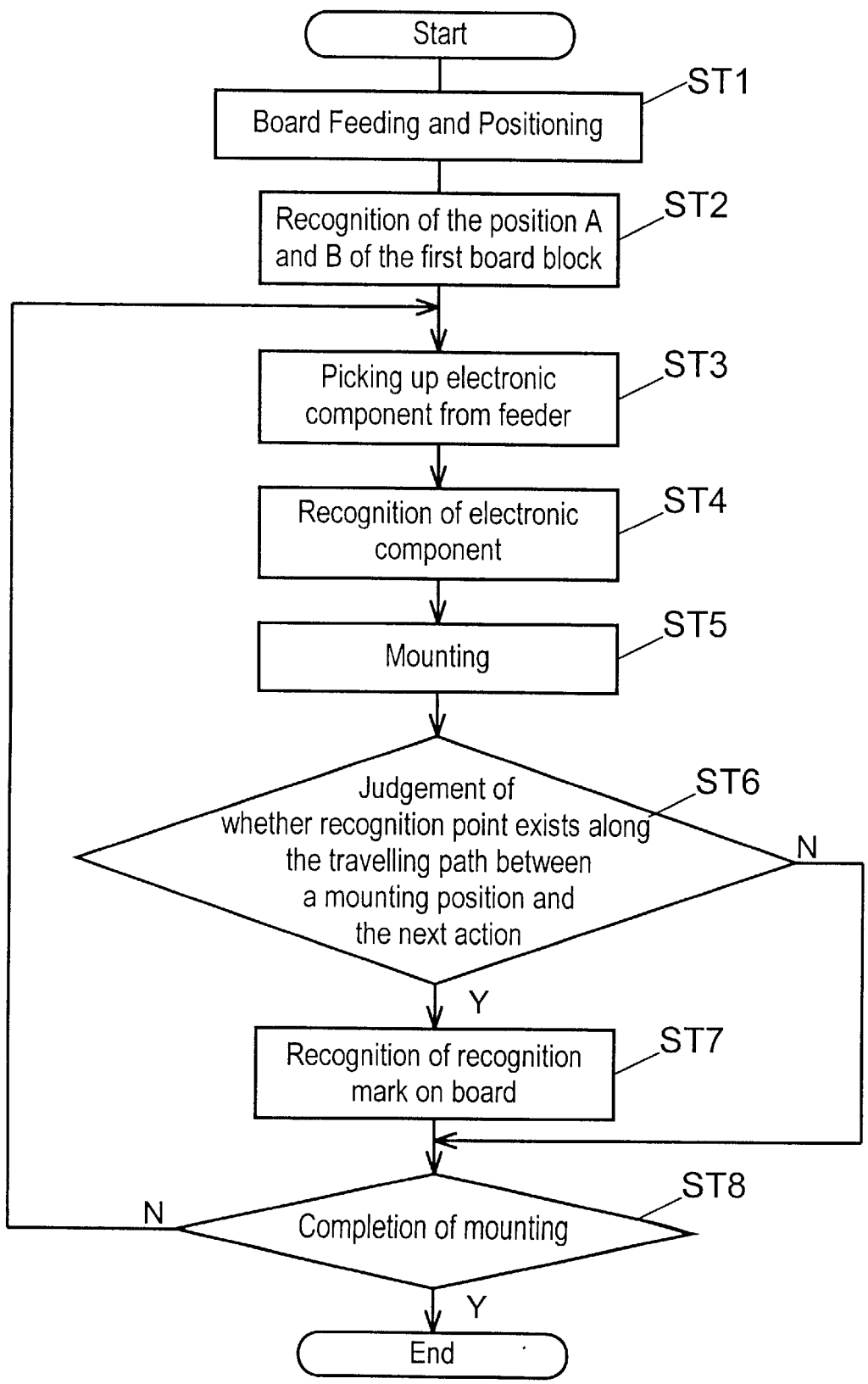
FIG. 4 is a flow chart showing an exemplary embodiment of a surface mounting method of electronic components, according to the present invention.

The action of the electronic component surface mounting apparatus as described above will be described further with reference to FIG. 5 along with the flowchart of FIG. 4. First, according to the flowchart of FIG. 4, the board 3 is transferred onto the carrier path 2, and the board 3 is positioned (ST1). The board 3 is constituted with like board blocks 31, 32, 33, 34 and so on, and, as shown in FIG. 5, recognition marks A and B for use in detecting board position recognition points and recognition marks m1 and m2 for use in detecting position correction recognition points during mounting of an electronic component 40 are provided on each board block 31, 32 and so on.

The mounting head 7, prior to mounting electronic components onto the board block, recognizes (i.e. detects position and compares with data in memory) the recognition marks A and B on the first board block 31 onto which an electronic component is to be mounted at a first location (ST2).

Figure 5:
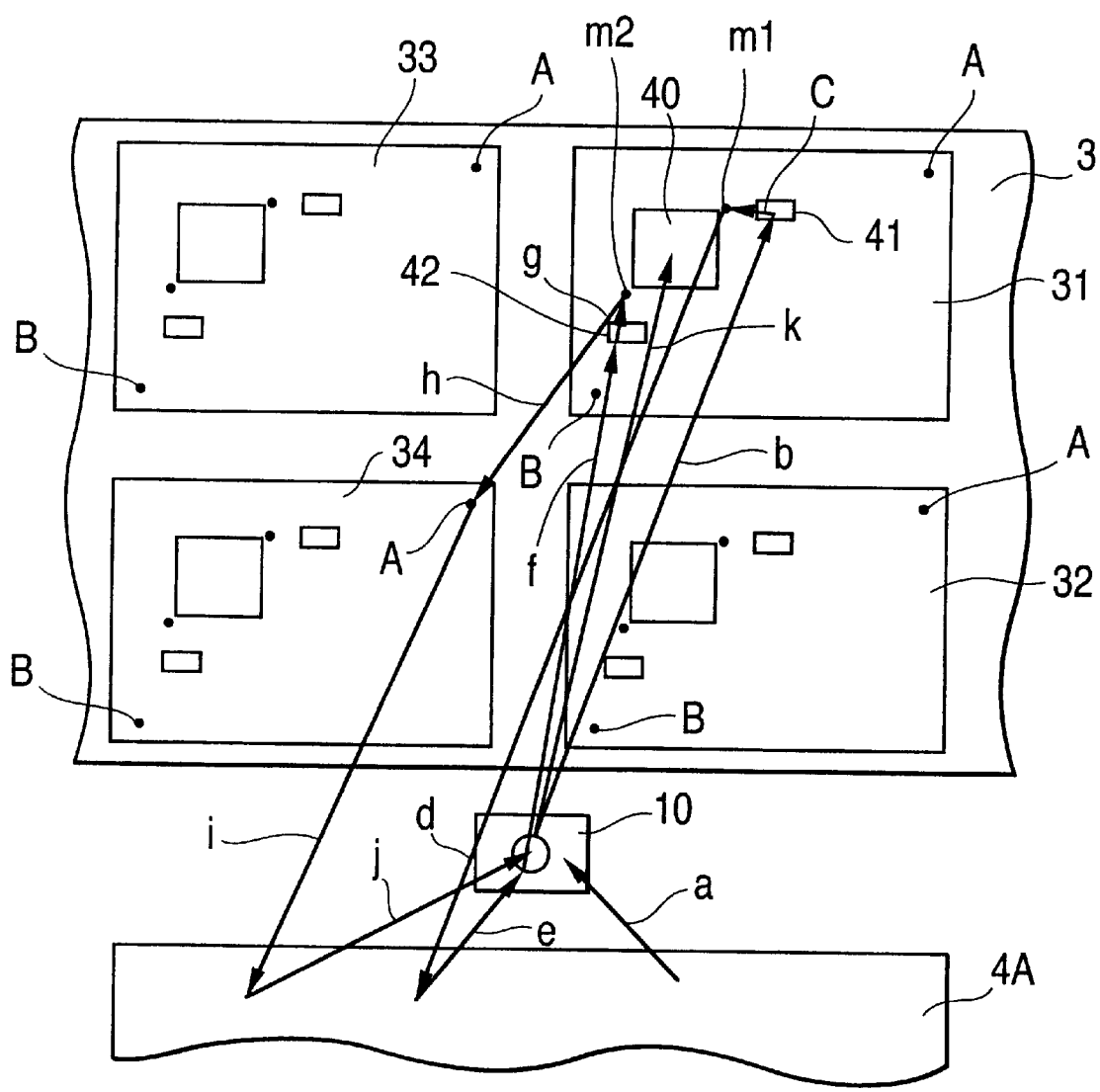
FIG. 5 is a drawing showing a travelling path of a mounting head in accordance with an exemplary embodiment of a surface mounting method of electronic components according to the present invention.

Next, the mounting head 7 moves to the feeder 4A and picks up an electronic component 41 (ST3) from the tape feeder 5 which contains the electronic component 41, moves and stops above the first camera 10 (as shown with arrow a in FIG. 5). Then, after the first camera 10 recognizes the electronic component 41 (ST4), the mounting head 7 moves above the board block 31 (as shown with arrow b), and mounts the electronic component 41.

While the mounting head 7 is travelling for the next action (e.g. for the purpose of picking up and mounting the next component), it is judged whether or not a recognition point exists (by judging whether or not a recognition mark exists), namely the recognition point for detecting the board position of the other board block, or the recognition point for position correction during mounting of the electronic component (ST6). When it is judged that the recognition mark ml exists nearby the mounting position of the electronic component 41 based upon the data memorized in the coordinate position memory 27 and the recognition mark information memory 28, the second camera 11 which travels unitarily together with the mounting head 7 is positioned above the recognition mark ml(arrow c), and recognizes the recognition mark m1 (i.e. detects the coordinates of the recognition mark such that the controller can compare its position with position data in the memory so as to correct dimensional errors) (ST7). Then at the next step, it is judged whether a surface mounting action onto the specific board has been completed or not (ST8), and the surface mounting action is finished by confirming the completion thereof.

With the exemplary embodiment shown in FIG.5, since there is another electronic component to be mounted, the mounting head 7, after recognizing recognition mark m1, returns to the first feeder 4A again (arrow d) and picks up the electronic component 42. Then, after moving over the first camera 10 (arrow e) to allow recognition of the electronic component, it travels to the surface mounting position of the electronic component 42 (arrow fl. After mounting the electronic component 42, the above mentioned judgement (of whether or not a nearby recognition mark exists) is made and, upon the mounting head and second camera moving above the recognition mark m2 (arrow g) which is the nearby recognition mark, the recognition mark m2 is recognized. Then the mounting head 7 takes the action to return to the first feeder 4A. However, since there is the recognition mark A which represents the recognition point for position detection of the board block 34 nearby the travelling path (i.e. along the travelling path so as to be in view of the camera during travel), the mark A is recognized on the way back to the first feeder 4A (arrow h), and then the mounting head 7 reaches the first feeder 4 A (arrow i).

After picking up the electronic component 40, for which it has now become possible to make the position correction by recognizing these recognition marks m1 and m2 , and after moving over the first camera 10 (arrow j), the mounting head 7 moves to the mounting position (arrow k) and mounts the electronic component 40. After that, the electronic components are mounted onto the other board block 32 one after another. And a judgement is always made during these mounting processes as to whether a recognition point exists nearby the travelling path of the mounting head 7 or not. Thus in the case where the moving head for surface mounting and the board image detection camera move unitarily together, useless movement of the mounting head can be eliminated by having the recognition action occur during the mounting operation. The tact time for mounting can thus be shortened by minimizing the total moving distance of the mounting head.

Although this exemplary embodiment presents an example of the board which is divided into plural board blocks, the present invention is not limited only to this embodiment. The object on which the electronic components are mounted can be a single block board.

In this case, also, as described above, the recognition point for board position detection is recognized in the first place, prior to electronic component mounting, and then the recognition point for electronic component position correction which exists nearby is to be recognized during the electronic component mounting action that takes place afterwards. Also, this exemplary embodiment uses an example in which the mounting head 7 moves to the recognition point after mounting the electronic component. But in a case in which the recognition point exists near the path while the mounting head 7 is moving with the electronic component held with the nozzle, the mounting head 7 can be moved to the recognition point while holding the electronic component and can perform the recognition action.

The present invention judges whether or not a recognition point exists nearby the travelling path of the mounting head while it is travelling toward the next action, and performs recognition by moving the camera above the recognition point during travelling. Accordingly, useless travelling of the mounting head can be eliminated and tact time of the mounting operation can be shortened by minimizing the total moving distance of the mounting head.

What is claimed is:

1. A surface mounting method of an electronic component mounting machine provided with a controller, a mounting head for picking up an electronic component from a feeder, and carrying and mounting the electronic component on a printed circuit board, and a camera for recognizing a position recognition point disposed on the printed circuit board, wherein the camera and the mounting head move unitarily, said method comprising:

judging whether the position recognition point exists along a traveling path of the mounting head based upon position data memorized in a memory of the controller while the mounting head is traveling to perform an operation of either mounting or picking up an electrical component;

interrupting the traveling if it is judged that the position recognition point exists along the traveling path;

recognizing the position recognition point by moving the camera to a position above the position recognition point; and correcting a position of the camera by comparing the position of the position recognition point with the position data in the memory.

2. A surface mounting method according to claim 1, wherein said recognizing the position recognition point comprises detecting the position of the position recognition point prior to mounting an electronic component.

3. A surface mounting method according to claim 1, wherein the printed circuit board comprises a plurality of printed circuit boards, and said recognizing the position recognition point comprises detecting the position recognition point disposed on a first printed circuit board of the plurality of printed circuit boards.

4. A surface mounting method according to claim 1, wherein said recognizing the position recognition point occurs while the mounting head is traveling to an electronic component feeder after an electronic component has been mounted.

5. A surface mounting method according to claim 1, wherein said recognizing the position recognition point occurs while the mounting head is traveling to a component mounting position after an electronic component has been picked up.

6. A surface mounting method of an electronic component mounting machine having a controller, a mounting head for picking up, carrying and mounting an electronic component and a camera for recognizing a position recognition point disposed on a printed circuit board, wherein the mounting head and the camera move unitarily, said method comprising:

recognizing a printed circuit board recognition point for detecting a printed circuit board position; and while the mounting head is traveling over the printed circuit board, recognizing an electronic component recognition point disposed on the printed circuit board for correcting a mounting position of the electronic component using the camera.

7. A surface mounting method according to claim 6, wherein said recognizing the electronic recognition point occurs while the mounting head is traveling to an electronic component feeder after an electronic component has been mounted.

8. A surface mounting method according to claim 6, wherein said recognizing the electronic recognition point occurs while the mounting head is traveling to a component mounting position after an electronic component has been picked up.

9. A surface mounting method of an electronic component mounting machine having a mounting head for picking up, carrying and mounting an electronic component and a camera for recognizing a position recognition point disposed on a printed circuit board, wherein the mounting head and the camera move unitarily, said method comprising:

while the mounting head is traveling along a traveling path to perform a current operation of either mounting or picking up an electric component, judging whether a position recognition point exists near the traveling path of the mounting head, wherein the position recognition point is not required to perform the current operation; and if it is judged that the position recognition point exists near the traveling path, interrupting the traveling and moving the camera above the position recognition point, recognizing the position recognition point and then resuming the traveling.

10. A surface mounting method according to claim 9, wherein said judging comprises judging whether the position recognition point exists near the current traveling path of the mounting head based on data of coordinates on mounting positions of electronic components, data of recognition marks for board position detection and information for recognition marks for position detection stored in a memory.

11. A surface mounting method according to claim 9, wherein said recognizing comprises detecting coordinates of the position recognition point.

12. A surface mounting method according to claim 11, wherein said recognizing further comprises:

comparing the coordinates of the position recognition point with position data in a memory to find discrepancies; and correcting any discrepancies determined by said comparing.

* * * * *